US012057339B2

(12) United States Patent
Li et al.

(10) Patent No.: US 12,057,339 B2
(45) Date of Patent: Aug. 6, 2024

(54) BIPOLAR ELECTROSTATIC CHUCK TO LIMIT DC DISCHARGE

(71) Applicant: Applied Materials, Inc., Santa Clara, CA (US)

(72) Inventors: Jian Li, Fremont, CA (US); Dmitry A. Dzilno, Sunnyvale, CA (US); Juan Carlos Rocha-Alvarez, San Carlos, CA (US); Zheng J. Ye, Santa Clara, CA (US); Paul L. Brillhart, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 564 days.

(21) Appl. No.: 17/078,542

(22) Filed: Oct. 23, 2020

(65) Prior Publication Data
US 2022/0130704 A1      Apr. 28, 2022

(51) Int. Cl.
   *H01L 21/683*     (2006.01)
   *H01J 37/32*      (2006.01)
   *H01L 21/687*     (2006.01)

(52) U.S. Cl.
   CPC .... *H01L 21/6833* (2013.01); *H01J 37/32082* (2013.01); *H01J 37/32541* (2013.01);
   (Continued)

(58) Field of Classification Search
   None
   See application file for complete search history.

(56) References Cited

U.S. PATENT DOCUMENTS

| | | | | |
|---|---|---|---|---|
| 5,886,866 A | * | 3/1999 | Hausmann | .......... H01L 21/6833 |
| | | | | 279/128 |
| 5,986,874 A | * | 11/1999 | Ross | .................... H01L 21/6831 |
| | | | | 279/128 |

(Continued)

FOREIGN PATENT DOCUMENTS

| | | | |
|---|---|---|---|
| JP | S63-125674 A | | 5/1988 |
| JP | 09223729 A | * | 8/1997 |

(Continued)

OTHER PUBLICATIONS

English Machine translation of Kawabe JPH09223729A retrieved from ESPACENET Feb. 8, 2023 (Year: 2023).*

(Continued)

*Primary Examiner* — Ram N Kackar
*Assistant Examiner* — Laureen Chan
(74) *Attorney, Agent, or Firm* — Kilpatrick Townsend & Stockton LLP

(57) ABSTRACT

Exemplary support assemblies may include an electrostatic chuck body defining a support surface that defines a substrate seat. The assemblies may include a support stem coupled with the chuck body. The assemblies may include a heater embedded within the chuck body. The assemblies may include a first bipolar electrode embedded within the electrostatic chuck body between the heater and support surface. The assemblies may include a second bipolar electrode embedded within the chuck body between the heater and support surface. Peripheral edges of one or both of the first and second bipolar electrodes may extend beyond an outer periphery of the seat. The assemblies may include an RF power supply coupled with the first and second bipolar electrodes. The assemblies may include a first floating DC power supply coupled with the first bipolar electrode. The (Continued)

assemblies may include a second floating DC power supply coupled with the second bipolar electrode.

7 Claims, 9 Drawing Sheets

(52) U.S. Cl.
CPC .. *H01J 37/32697* (2013.01); *H01J 37/32715* (2013.01); *H01L 21/68757* (2013.01)

(56) References Cited

U.S. PATENT DOCUMENTS

| | | | | |
|---|---|---|---|---|
| 6,088,213 | A * | 7/2000 | Herchen | C23C 16/4586 257/714 |
| 6,431,112 | B1 * | 8/2002 | Sill | H01J 37/32174 118/723 R |
| 2001/0003298 | A1 * | 6/2001 | Shamouilian | H01L 21/67069 156/345.43 |
| 2007/0297118 | A1 * | 12/2007 | Fujii | H02N 13/00 361/234 |
| 2013/0107415 | A1 * | 5/2013 | Banna | H01L 21/6831 361/234 |
| 2017/0040198 | A1 * | 2/2017 | Lin | H01L 21/68735 |
| 2018/0366306 | A1 * | 12/2018 | Yang | H01J 37/32715 |
| 2019/0393021 | A1 * | 12/2019 | Hironaka | H01L 21/30604 |

FOREIGN PATENT DOCUMENTS

| | | | |
|---|---|---|---|
| JP | H09-223729 A | | 8/1997 |
| JP | 2003059910 A | * | 2/2003 |
| KR | 2005-0103504 A | | 10/2005 |
| KR | 2014-0088583 A | | 7/2014 |
| TW | 201320235 A | | 5/2013 |
| TW | 201731131 A | | 9/2017 |
| WO | 2019-169102 A1 | | 9/2019 |

OTHER PUBLICATIONS

English Machine translation Takeishi JP 2003059910 A retrieved from Search Fit database (Year: 2023).*
English Machine Translation Takeishi JP2003059910A retrieved from Search Fit (Year: 2023).*
International Search Report and Written Opinion mailed Feb. 11, 2022 in International Patent Application No. PCT/US2021/055664, 9 pages.

* cited by examiner

BIPOLAR ELECTROSTATIC CHUCK TO LIMIT DC DISCHARGE

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. The temperature at which these processes occur may directly impact the final product. Substrate temperatures are often controlled and maintained with the assembly supporting the substrate during processing. Internally located heating devices may generate heat within the support, and the heat may be transferred conductively to the substrate. The substrate support may also be utilized in some technologies to develop a substrate-level plasma, as well as to chuck the substrate to the support electrostatically. Plasma generated near the substrate may cause bombardment of components, as well as parasitic plasma formation in unfavorable regions of the chamber. The conditions may also lead to discharge between substrate support electrodes. Additionally, utilizing the pedestal for both heat generation and plasma generation may cause interference effects.

As a variety of operational processes may utilize increased temperature as well as substrate-level plasma formation, constituent materials of the substrate support may be exposed to temperatures that affect the electrical operations of the assembly. Thus, there is a need for improved systems and methods that can be used to produce high quality devices and structures. These and other needs are addressed by the present technology.

SUMMARY

Exemplary support assemblies may include an electrostatic chuck body defining a substrate support surface that defines a substrate seat. The substrate support assemblies may include a support stem coupled with the electrostatic chuck body. The substrate support assemblies may include a heater embedded within the electrostatic chuck body. The substrate support assemblies may include a first bipolar electrode embedded within the electrostatic chuck body between the heater and the substrate support surface. The substrate support assemblies may include a second bipolar electrode embedded within the electrostatic chuck body between the heater and the substrate support surface. A peripheral edge of one or both of the first bipolar electrode and the second bipolar electrode may extend beyond an outer periphery of the substrate seat. The substrate support assemblies may include an RF power supply coupled with both of the first bipolar electrode and the second bipolar electrode. The substrate support assemblies may include a first floating DC power supply coupled with the first bipolar electrode. The substrate support assemblies may include a second floating DC power supply coupled with the second bipolar electrode.

In some embodiments, each of the first bipolar electrode and the second bipolar electrode may include a semicircular mesh. Arc portions of each semicircular mesh may extend radially outward of the substrate seat. The first bipolar electrode and the second bipolar electrode may be separated by a gap. The substrate support assembly may include conductive patches disposed on opposing ends of the gap that electrically couple the first bipolar electrode and the second bipolar electrode. At least a portion of each conductive patch may be disposed radially outward of the substrate seat. Each conductive patch may be formed from a material that has a coefficient of thermal expansion that is substantially the same as a coefficient of thermal expansion of a material that forms the electrostatic chuck body. A portion of each conductive patch may extend over a top surface of each of the first bipolar electrode and the second bipolar electrode. Each conductive patch may include a vertical portion that overlaps a side surface of each of the first bipolar electrode and the second bipolar electrode. The first bipolar electrode may define a cutout that receives the second bipolar electrode. Only the peripheral edge of the first bipolar electrode may extend beyond the outer periphery of the substrate seat. The second bipolar electrode may include a semicircular mesh. The first bipolar electrode may include a mesh having a circular outer periphery. The cutout may have a semicircular shape that receives the semicircular mesh. The second bipolar electrode may include a mesh having a first section and a second section that extends from the first section. The first section may have a semicircular shape. The second section may have an arc shape. The semicircular shape and the arc shape may have a constant rate of curvature. The first bipolar electrode may include a mesh having a circular outer periphery. The cutout may have a size and shape that substantially matches a size and shape of the mesh of the second bipolar electrode. The electrostatic chuck body may include a ceramic material. The seat may be defined by a recessed region formed in the support surface.

Some embodiments of the present technology may also encompass substrate support assemblies that include an electrostatic chuck body defining a substrate support surface that defines a substrate seat. The substrate support assemblies may include a support stem coupled with the electrostatic chuck body. The substrate support assemblies may include a heater embedded within the electrostatic chuck body. The substrate support assemblies may include a first bipolar electrode embedded within the electrostatic chuck body between the heater and the substrate support surface. The substrate support assemblies may include a second bipolar electrode embedded within the electrostatic chuck body between the heater and the substrate support surface. Peripheral edges of the first bipolar electrode and the second bipolar electrode may be substantially aligned with an outer periphery of the substrate seat. The substrate support assemblies may include an RF electrode having an outer periphery that extends beyond the peripheral edges of the first bipolar electrode and the second bipolar electrode. The substrate support assemblies may include an RF power supply coupled with the RF electrode. The substrate support assemblies may include a first floating DC power supply coupled with the first bipolar electrode. The substrate support assemblies may include a second floating DC power supply coupled with the second bipolar electrode.

In some embodiments, the RF electrode may be disposed beneath the first bipolar electrode and the second bipolar electrode. The RF electrode may include a generally circular mesh. The RF electrode may be disposed at substantially a same height as the first bipolar electrode and the second bipolar electrode. The RF electrode may include a mesh having a generally annular shape. The RF power supply may be coupled with the first bipolar electrode and the second bipolar electrode. Each of the first bipolar electrode and the second bipolar electrode may include a semicircular mesh.

Some embodiments of the present technology may also encompass substrate support assemblies that include an electrostatic chuck body defining a substrate support surface that defines a substrate seat. The substrate support assemblies may include a support stem coupled with the electrostatic chuck body. The substrate support assemblies may include a heater embedded within the electrostatic chuck body. The substrate support assemblies may include a first bipolar electrode embedded within the electrostatic chuck body between the heater and the substrate support surface. The substrate support assemblies may include a second bipolar electrode embedded within the electrostatic chuck body between the heater and the substrate support surface. Peripheral edges of the first bipolar electrode and the second bipolar electrode may be substantially aligned with an outer periphery of the substrate seat. The substrate support assemblies may include an RF electrode having an outer periphery that extends beyond the peripheral edges of the first bipolar electrode and the second bipolar electrode.

Such technology may provide numerous benefits over conventional systems and techniques. For example, embodiments of the present technology may provide substrate supports that may allow radial tuning during plasma processing, and may remain sustainable during high-temperature operations. Additionally, the substrate supports may maintain bipolar chucking while supporting RF modulation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
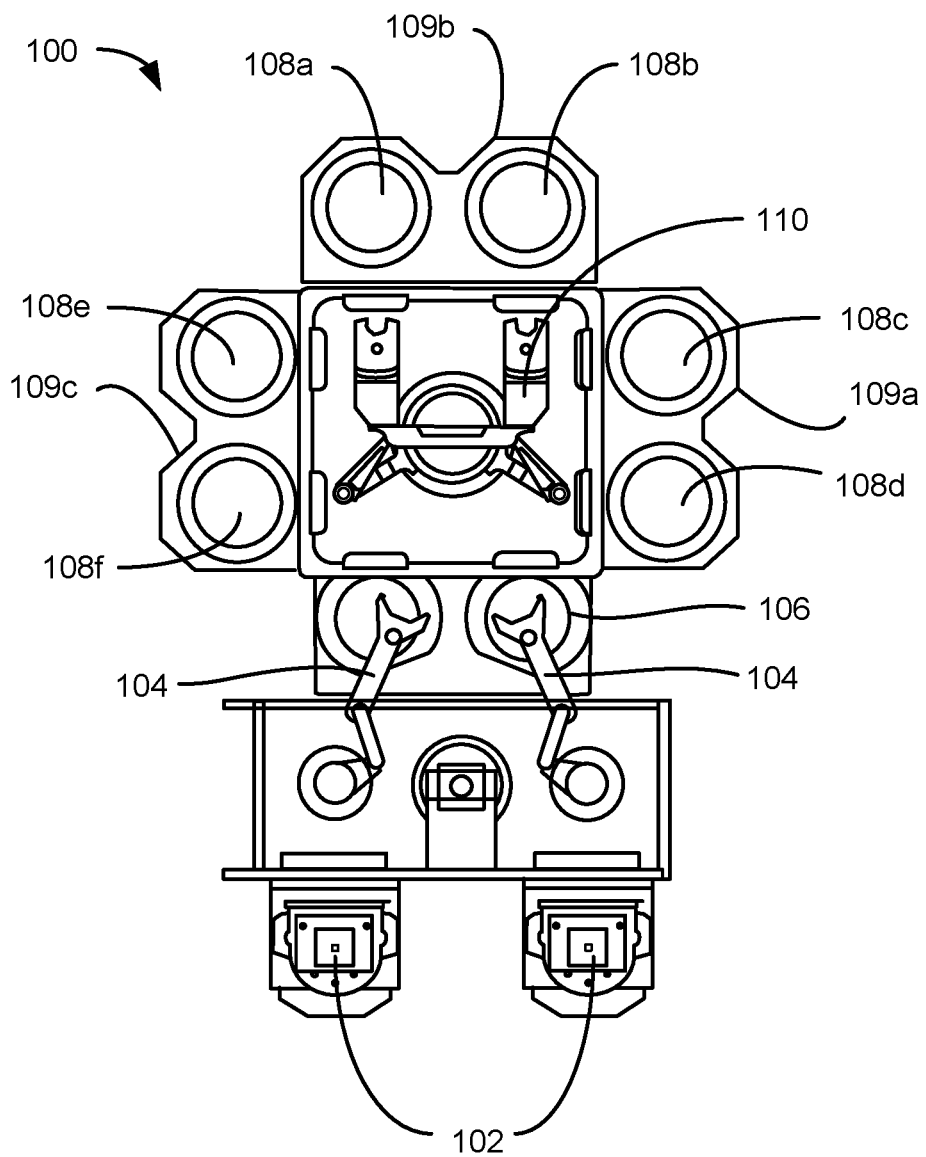
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. These formed films may be produced under conditions that cause stresses on the substrate. An electrostatic chuck may be used to produce a clamping action against the substrate to overcome the bowing stress. However, as semiconductor processing continues to increase precision and reduce device sizes, chucking may participate in issues with processing. Additionally, many of these films may be developed at relatively high temperatures that further affect components of the chamber. For example, some deposition activities may occur at temperatures above 500° C. or higher, which may affect the resistivity of chamber components, such as the materials of the electrostatic chuck. As the resistivity of the material reduces, current leakage may increase and lead to electric arcs being produced between the electrostatic chuck and the grounded chamber wall and/or faceplate. This arcing may damage substrates and chamber components.

Many conventional technologies use a monopolar or semicircular electrode bipolar electrostatic chuck, which may lead to many of these processing issues. While the chucks may provide chucking force to stabilize a substrate during processing, the chucks may be otherwise limited, and may contribute to issues with processing. For example, monopolar chucks may cause substrate movement, which can impact process uniformity by shifting a chuck from a central location within the processing chamber. A monopolar chuck utilizes plasma generated during the process to create electrostatic force on the substrate. When a substrate is seated on a support and a monopolar chuck is initially engaged, the wafer may be electrically floating relative to the DC power source of the chucking electrode because the puck body may be insulative. When a plasma is generated, the plasma may ground the substrate, which may effectively complete the circuit and create an electrostatic force between the substrate and chuck body. However, the initial generation may cause movement of the substrate, which may impact uniformity during processing.

Conventional bipolar chucks may include two semicircular electrodes, which may overcome issues with the monopolar chuck by coupling one electrode at positive power and one at negative power. Although the substrate will still be characterized by a net neutral charge, the substrate may be clamped to the substrate support. However, as processing temperatures are raised, leakage through the chuck body may increase, which may increase a likelihood of DC discharge between the two electrodes. This DC discharge may result in arcing across a gap that separates the electrodes at positions of the gap that are not covered by the wafer. This arcing may cause sputtering of plasma particles on one or more chamber components, such as the heater, faceplate, and/or liner.

The present technology overcomes these challenges with substrate support assemblies having bipolar chucking capabilities and may include electrode configurations that prevent the occurrence of arcing across electrode gaps and/or between the electrostatic chuck and the chamber wall and/or faceplate. Additionally, the present technology may implement RF electrode configurations that ensure gapless RF electrode coverage at areas proximate to and extending beyond the periphery of the wafer. The RF electrode configurations may facilitate more uniform RF fields and subsequently more uniform plasma deposition across the wafer, including edge regions of the wafer.

Although the remaining disclosure will routinely identify specific deposition processes utilizing the disclosed technology, it will be readily understood that the systems and methods are equally applicable to other deposition, etching, and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
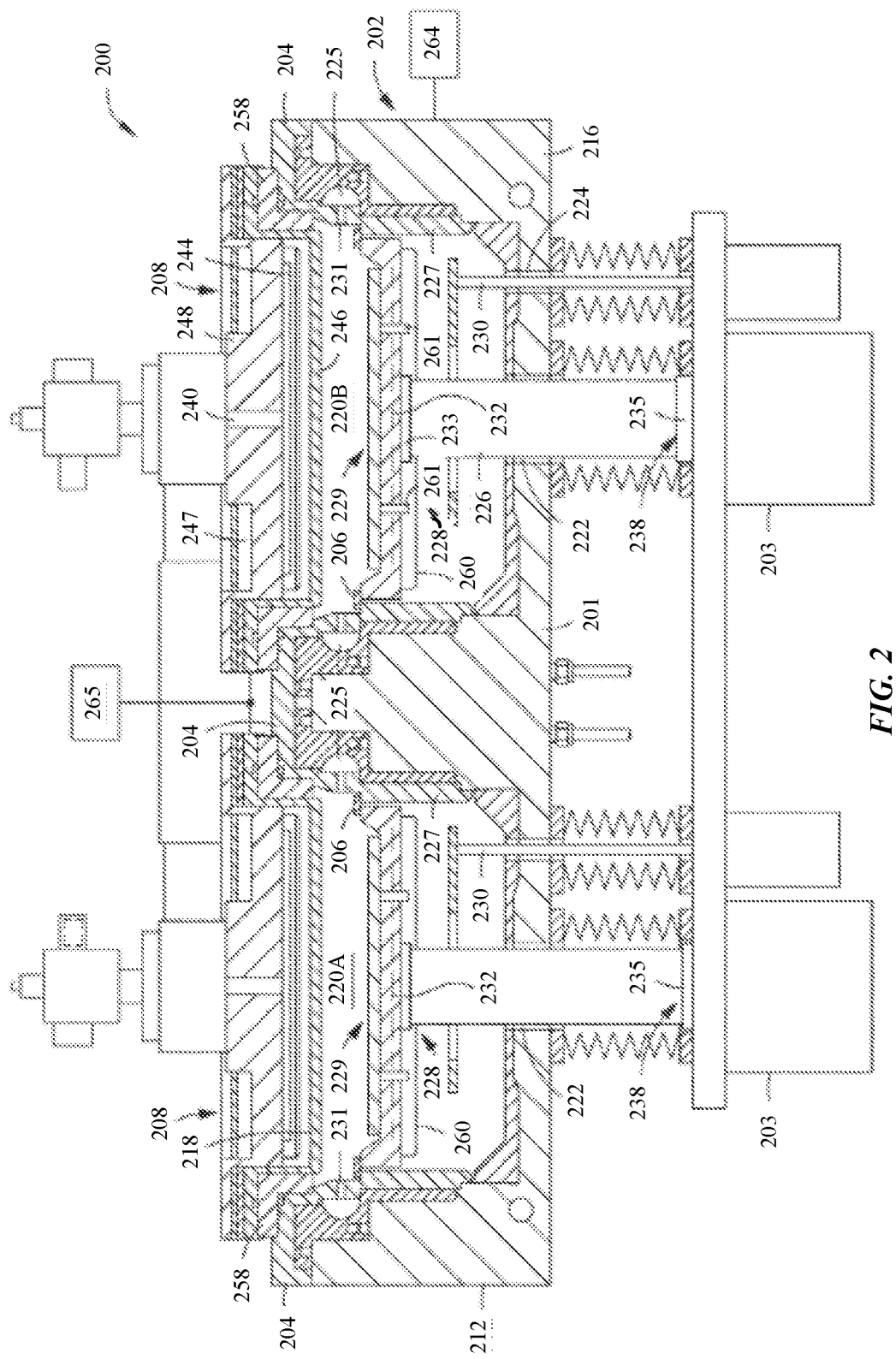
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
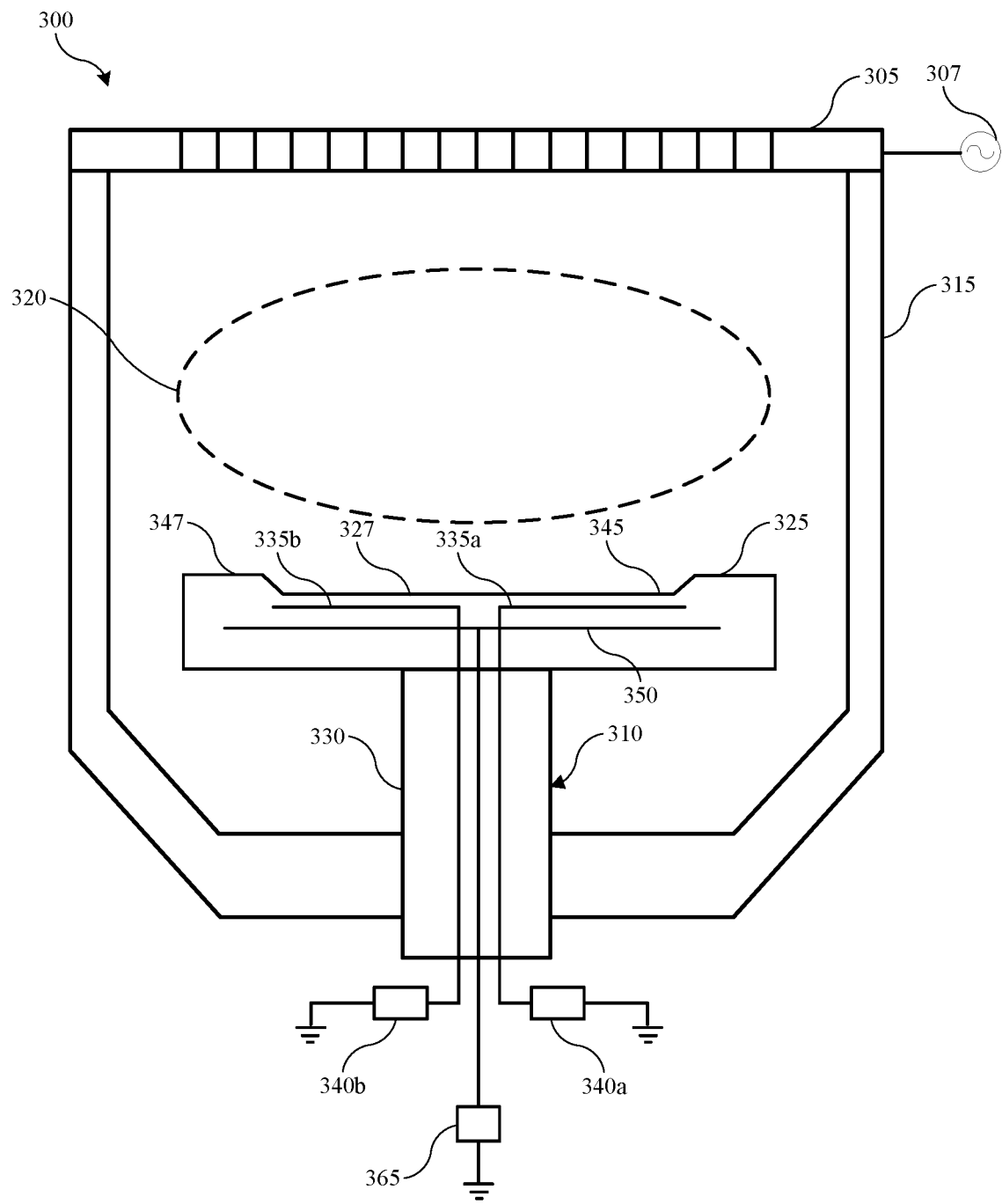
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate support surface 327, and may be characterized by a thickness and length or diameter depending on the specific geometry of the chuck body. In some embodiments the chuck body may be elliptical, and may be characterized by one or more radial dimensions from a central axis through the chuck body. It is to be understood that the top puck may be any geometry, and when radial dimensions are discussed, they may define any length from a central position of the chuck body.

Electrostatic chuck body 325 may be coupled with a stem 330, which may support the chuck body and may include channels for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include a first bipolar electrode 335a, which may be embedded within the chuck body proximate the substrate support surface. Electrode 335a may be electrically coupled with a DC power source 340a. Power source 340a may be configured to provide energy or voltage to the electrically conductive chuck electrode 335a. This may be operated to form a plasma of a precursor within the processing region 320 of the semiconductor processing chamber 300, although other plasma operations may similarly be sustained. For example, electrode 335a may also be a chucking mesh that operates as electrical ground for a capacitive plasma system including an RF source 307 electrically coupled with showerhead 305. For example, electrode 335a may operate as a ground path for RF power from the RF source 307, while also operating as an electric bias to the substrate to provide electrostatic clamping of the substrate to the substrate support surface. Power source 340a may include a filter, a power supply, and a number of other electrical components configured to provide a chucking voltage.

The electrostatic chuck body may also include a second bipolar electrode 335b, which may also be embedded within the chuck body proximate the substrate support surface. Electrode 335b may be electrically coupled with a DC power source 340b. Power source 340b may be configured to provide energy or voltage to the electrically conductive chuck electrode 335b. Additionally electrical components and details about bipolar chucks according to some embodiments will be described further below, and any of the designs may be implemented with processing chamber 300. For example, additional plasma related power supplies or components may be incorporated as will be explained further below.

In operation, a substrate may be in at least partial contact with the substrate support surface of the electrostatic chuck body, which may produce a contact gap, and which may essentially produce a capacitive effect between a surface of the pedestal and the substrate. Voltage may be applied to the contact gap, which may generate an electrostatic force for chucking. The power supplies 340a and 340b may provide electric charge that migrates from the electrode to the substrate support surface where it may accumulate, and which may produce a charge layer having Coulomb attraction with opposite charges at the substrate, and which may electrostatically hold the substrate against the substrate support surface of the chuck body. This charge migration may occur by current flowing through a dielectric material of the chuck body based on a finite resistance within the dielectric for Johnsen-Rahbek type chucking, which may be used in some embodiments of the present technology.

Chuck body 325 may also define a recessed region 345 within the substrate support surface, which may provide a recessed pocket in which a substrate may be disposed. Recessed region 345 may be formed at an interior region of the top puck and may be configured to receive a substrate for processing. Recessed region 345 may encompass a central region of the electrostatic chuck body as illustrated, and may be sized to accommodate any variety of substrate sizes. A substrate may be seated within the recessed region, and contained by an exterior region 347, which may encompass the substrate. In some embodiments the height of exterior region 347 may be such that a substrate is level with or recessed below a surface height of the substrate support surface at exterior region 347. A recessed surface may control edge effects during processing, which may improve uniformity of deposition across the substrate in some embodiments. In some embodiments, an edge ring may be disposed about a periphery of the top puck, and may at least partially define the recess within which a substrate may be seated. In some embodiments, the surface of the chuck body may be substantially planar, and the edge ring may fully define the recess within which the substrate may be seated.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as well. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body and/or substrate. Heater 350 may include multiple heaters in embodiments, and each heater may be associated with a zone of the chuck body, and thus exemplary chuck bodies may include a similar number or greater number of zones than heaters. The chucking mesh electrodes 335 may be positioned between the heater 350 and the substrate support surface 327 in some embodiments, and a distance may be maintained between the electrode within the chuck body and the substrate support surface in some embodiments as will be described further below.

The heater 350 may be capable of adjusting temperatures across the electrostatic chuck body 325, as well as a substrate residing on the substrate support surface 327. The heater may have a range of operating temperatures to heat the chuck body and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, the chuck heater may be operated to maintain a substrate temperature above at least 500° C. during deposition operations.

Figure 4A:
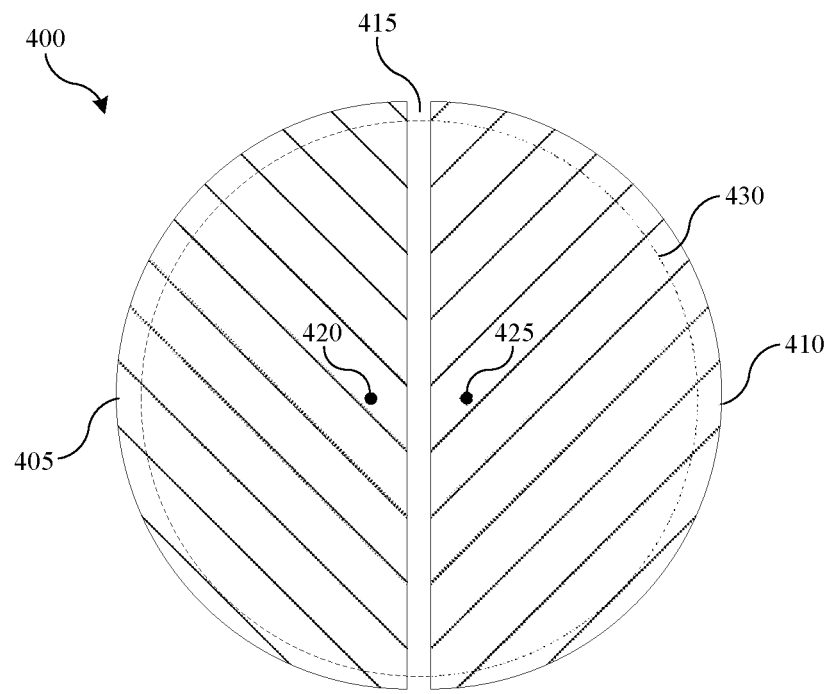
FIG. 4A shows a schematic top view of an electrode arrangement for an exemplary substrate support assembly according to some embodiments of the present technology.

FIG. 4A shows a schematic top view of an electrode arrangement 400 for an exemplary substrate support assembly according to some embodiments of the present technology. Electrodes in arrangement 400 may be any of the electrodes previously described, such as may be included in substrate support assembly 310, or any other number of pedestals or chucks. The electrodes may be operable as an electrostatic chuck as discussed above, and as will be further described below. As illustrated, electrode arrangement 400 may include a first bipolar electrode 405, and a second bipolar electrode 410. The electrodes may be embedded in a puck or chuck body as described above, such as a ceramic including aluminum nitride, and may be characterized by any of the features, configurations, or characteristics as discussed above for any substrate support.

First bipolar electrode 405 and second bipolar electrode 410 may each include a mesh material that may be substantially coplanar across both electrodes within the electrostatic chuck. The mesh materials may be characterized by any number of shapes or geometries. As illustrated, each mesh material has a semicircular shape, however other shapes such as rectangles, or any other shape may be used, which may be at least in part determined from substrate geometries, for example. The meshes of the first bipolar electrode 405 and the second bipolar electrode 410 may be separated by a gap 415. The meshes of each of the first bipolar electrode 405 and the second bipolar electrode 410 may have outer peripheries that extend radially outward beyond an outer periphery of a substrate seat 430 (which may match an outer periphery of a substrate being processed and may be formed from a recessed region, similar to recessed region 345) defined by the substrate support surface. For example, arced portions of each semicircular mesh may extend beyond the outer periphery of the substrate seat 430. Electrode leads may couple one or more power sources with the meshes of each of the first bipolar electrode 405, such as at position 420 and second bipolar electrode 410, such as at position 425, which may be anywhere along the mesh in some embodiments.

Figure 4B:
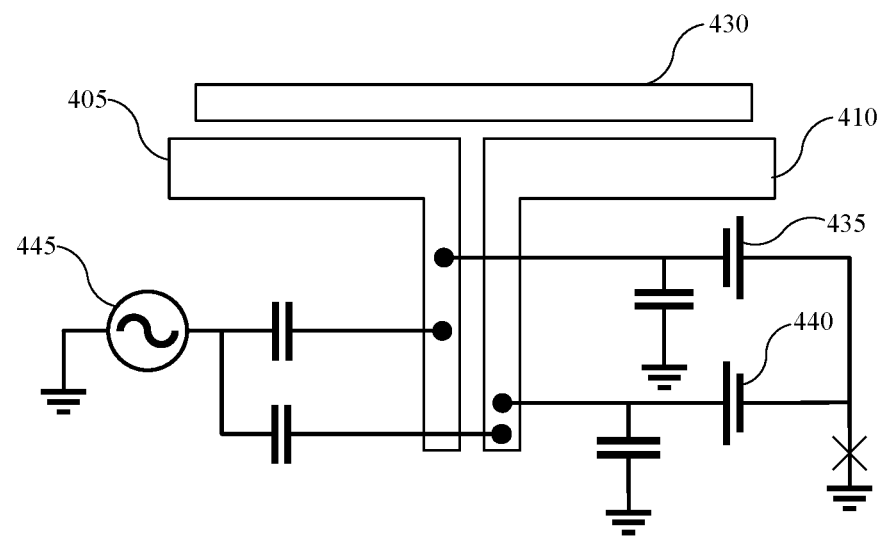
FIG. 4B shows a schematic partial cross-sectional view of an electrode arrangement for an exemplary substrate support assembly according to some embodiments of the present technology.

Each of the electrodes may be coupled with one or more power supplies as can be seen in FIG. 4B. FIG. 4B shows a schematic partial cross-sectional view of electrode arrangement 400 for an exemplary substrate support assembly according to some embodiments of the present technology.

As shown, the arrangement 400 may include a first bipolar electrode 405 and a second bipolar electrode 410.

Each electrode may be coupled with one or more power supplies as previously described, and FIG. 4B illustrates an exemplary coupling arrangement, although it is to be understood that any number of electrode coupling configurations may be used. For example, the first bipolar electrode sections may be coupled with a first DC power supply 435, and the second bipolar electrode may be coupled with a second DC power supply 440. Either power supply may be operated in a positive or negative voltage arrangement, which may be switched during processing, for example, as well as increased or decreased in either direction to provide electrostatic chucking. Each power supply may be floating (ungrounded), which eliminates a relative voltage differential between the electrodes and chamber surroundings, such as chamber sidewalls. One or more RF power supplies may also be incorporated in some embodiments. For example, an RF power supply 445 may be coupled with the first bipolar electrode 405 and the second bipolar electrode 410. Although a separate RF power supply may be coupled with each of the bipolar electrodes, as will be described below, in some embodiments a single power supply may be used based on the configuration of the electrodes.

In operation, by using floating DC power supplies in the electrode arrangement 400, a relative voltage differential between the electrodes and the grounded faceplate and/or chamber sidewalls is eliminated, which may eliminate any electrical arcing that may occur at ends of the gap 415. The elimination of arcing may reduce or eliminate plasma particle generation on the substrate support surface, faceplate, chamber sidewalls, and/or other chamber components proximate the ends of the gap 415. Additionally, by using meshes that extend radially beyond the edges of the substrate seat and wafer, RF flow may be delivered more uniformly across the wafer, including edge regions of the wafer. This facilitates more uniform plasma deposition across the wafer.

Figure 5A:
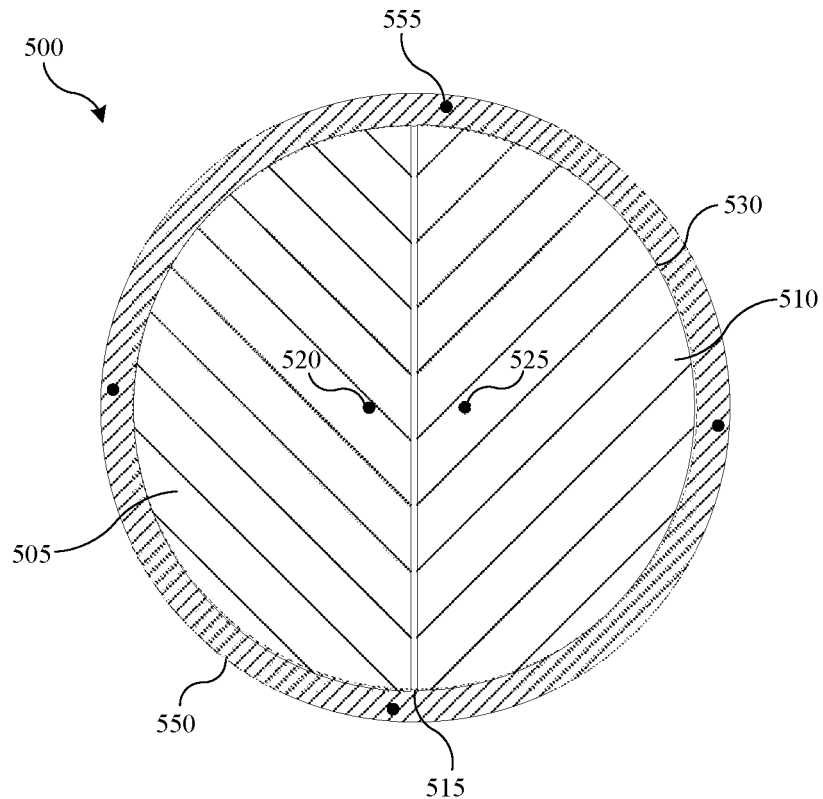
FIG. 5A shows a schematic top view of an electrode arrangement for an exemplary substrate support assembly according to some embodiments of the present technology.

The present technology may similarly encompass other bipolar chuck configurations that can be incorporated within any of the substrate supports as previously described. FIG. 5A shows a schematic top view of an electrode arrangement 500 for an exemplary substrate support assembly according to some embodiments of the present technology. Arrangement 500 may include any of the features or characteristics of arrangement 400, and may be incorporated in any substrate support in which bipolar chucking may be used, including any substrate support previously described. For example, arrangement 500 may include a first bipolar electrode 505 and a second bipolar electrode 510. First bipolar electrode 505 and second bipolar electrode 510 may each include a mesh material that may be substantially coplanar across both electrodes within the electrostatic chuck. As illustrated, each mesh material has a semicircular shape, however other shapes may be used. The meshes of the first bipolar electrode 505 and the second bipolar electrode 510 may be separated by a gap 515. The meshes of each of the first bipolar electrode 505 and the second bipolar electrode 510 may have outer peripheries that are substantially aligned with an outer periphery of a substrate seat 530 defined by the substrate support surface. For example, arced portions of each semicircular mesh may have a radius and curvature that substantially match a radius and curvature of the outer periphery of the substrate seat 530. Electrode leads may couple with the meshes of each of the first bipolar electrode 505, such as at position 520 and second bipolar electrode 510, such as at position 525, which may be anywhere along the mesh in some embodiments As illustrated, in some embodiments the arrangement 500 may include an RF electrode 550, which may be located or positioned radially outward from the first bipolar electrode 505 and the second bipolar electrode 510, and may extend about the bipolar electrodes as illustrated. For example, the RF electrode 550 may have a generally annular mesh having an outer periphery that extends beyond the peripheral edges of the first bipolar electrode 505 and the second bipolar electrode 510. In some embodiments, the mesh of the RF electrode 550 may be disposed below the meshes of the bipolar electrodes. In other embodiments, the mesh of the RF electrode 550 may be substantially coplanar with the meshes of the bipolar electrodes. In such embodiments, a diameter of an inner opening of the mesh be sized to minimize or eliminate a gap between the inner edge of the mesh of the RF electrode 550 and the arc portions of the bipolar electrodes. For example, the inner edge of the mesh of the RF electrode 550 may sit flush against the arced portions of the bipolar electrodes to provide a gapless RF path between the bipolar electrodes and the RF electrode 550. In some embodiments the RF electrode 550 may be included beneath the exterior region 347, for example, or may otherwise be about an edge region of the substrate support. Electrode leads may couple an RF power source with the RF electrode 550 at one or more positions 555 as illustrated. Although four such lead positions are illustrated, any number of leads may be provided in embodiments to ensure uniform delivery to the electrode. The leads may be provided at regular intervals about the RF electrode 550 to provide a symmetrical arrangement that may promote a uniform RF flow across the substrate support surface.

Figure 5B:
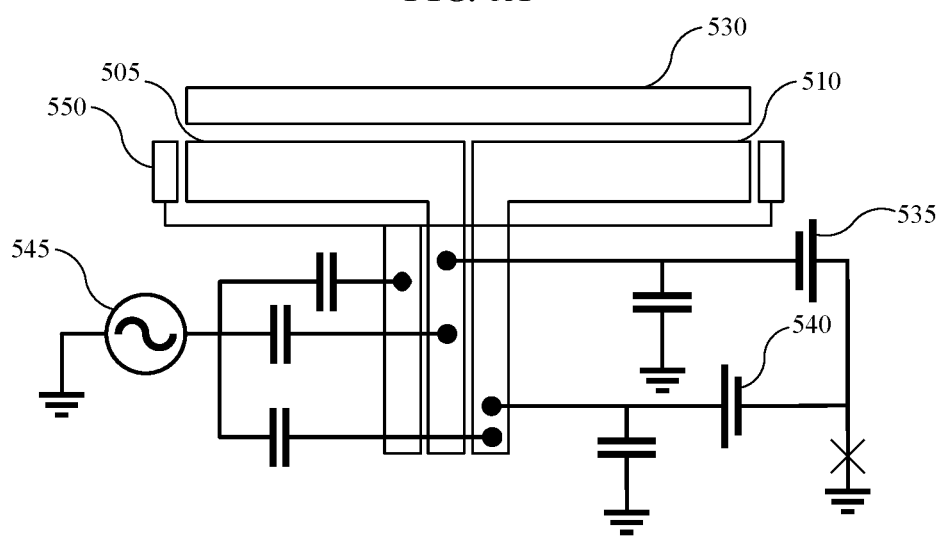
FIG. 5B shows a schematic partial cross-sectional view of an electrode arrangement for an exemplary substrate support assembly according to some embodiments of the present technology.

FIG. 5B shows a schematic partial cross-sectional view of electrode arrangement 500 for an exemplary substrate support assembly according to some embodiments of the present technology, and may include any feature, characteristic, or component as described above, and may be included in any substrate support described elsewhere. Similar to as described above, a first DC power supply 535 may be coupled with the first bipolar electrode 505, and a second DC power supply 540 may be coupled with the second bipolar electrode. The DC power supplies may be floating as previously discussed. Additionally, an RF power supply 545 may be coupled with the first bipolar electrode 505 and the second bipolar electrode 510, although each bipolar electrode may have a dedicated RF power supply in some embodiments. The RF power supply 545 (or a separate RF power source) may also be coupled with the RF electrode 550.

In operation, the RF electrode 550 positioned beyond the peripheral edges of the bipolar electrodes prevents the gap 515 from being exposed at positions outside of the wafer. By covering the gaps, electrical arcing may be prevented. Arcing may be further mitigated through the use of floating DC power supplies as discussed previously herein. The elimination of arcing may reduce or eliminate plasma particle generation on the substrate support surface, faceplate, chamber sidewalls, and/or other chamber components proximate the ends of the gap 515. Additionally, the placement of the RF electrode 550 may maintain RF continuity beyond the wafer to ensure that RF flow may be delivered more uniformly across the wafer, including edge regions of the wafer, to facilitate more uniform plasma deposition across the wafer.

Figure 6A:
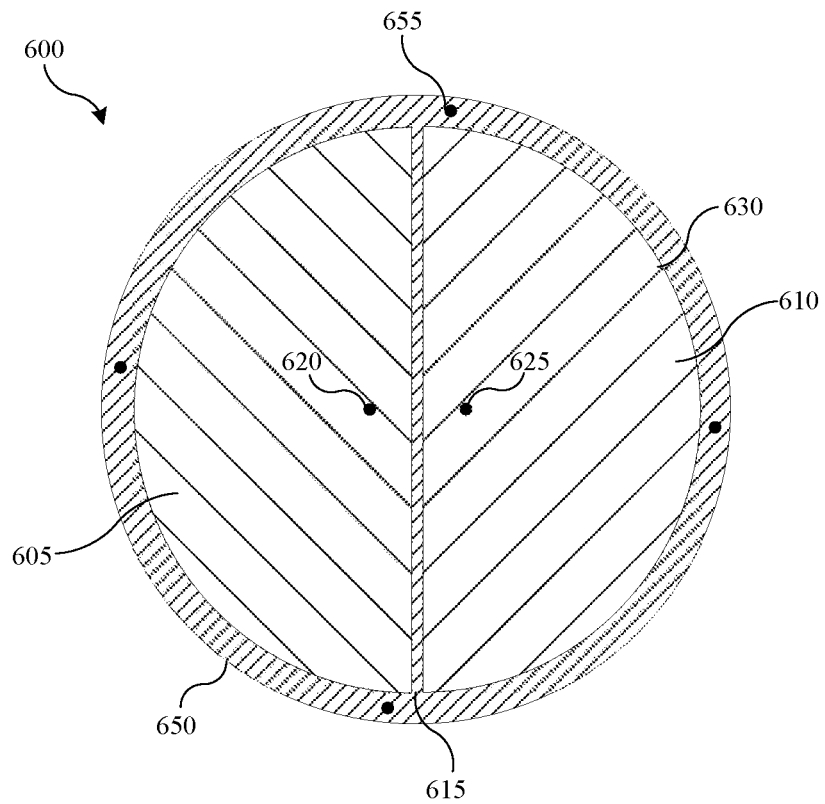
FIG. 6A shows a schematic top view of an electrode arrangement for an exemplary substrate support assembly according to some embodiments of the present technology.

FIG. 6A shows a schematic top view of an electrode arrangement 600 for an exemplary substrate support assembly according to some embodiments of the present technology. Arrangement 600 may include any of the features or characteristics of arrangement 400 or arrangement 500, and may be incorporated in any substrate support in which bipolar chucking may be used, including any substrate support previously described. For example, arrangement 600 may include a first bipolar electrode 605 and a second bipolar electrode 610. First bipolar electrode 605 and second bipolar electrode 610 may each include a mesh material that may be substantially coplanar across both electrodes within the electrostatic chuck. As illustrated, each mesh material has a semicircular shape, however other shapes may be used. The meshes of the first bipolar electrode 605 and the second bipolar electrode 610 may be separated by a gap 615. The meshes of each of the first bipolar electrode 605 and the second bipolar electrode 610 may have outer peripheries that are substantially aligned with an outer periphery of a substrate seat 630. Electrode leads may couple with the meshes of each of the first bipolar electrode 605, such as at position 620 and second bipolar electrode 610, such as at position 625, which may be anywhere along the mesh in some embodiments.

As illustrated, in some embodiments the arrangement 600 may include an RF electrode 650, which may have an outer periphery that extends beyond the peripheral edges of the first bipolar electrode 605 and the second bipolar electrode 610. For example, the RF electrode 650 may have a generally circular mesh that is coaxial with the substrate seat 630 and that has a greater radius than the substrate seat 630. The mesh of the RF electrode 650 may be disposed below the meshes of the bipolar electrodes. Electrode leads may couple an RF power source with the RF electrode 650 at one or more positions 655 as illustrated. Although four such lead positions are illustrated, any number of leads may be provided in embodiments to ensure uniform delivery to the RF electrode 650.

Figure 6B:
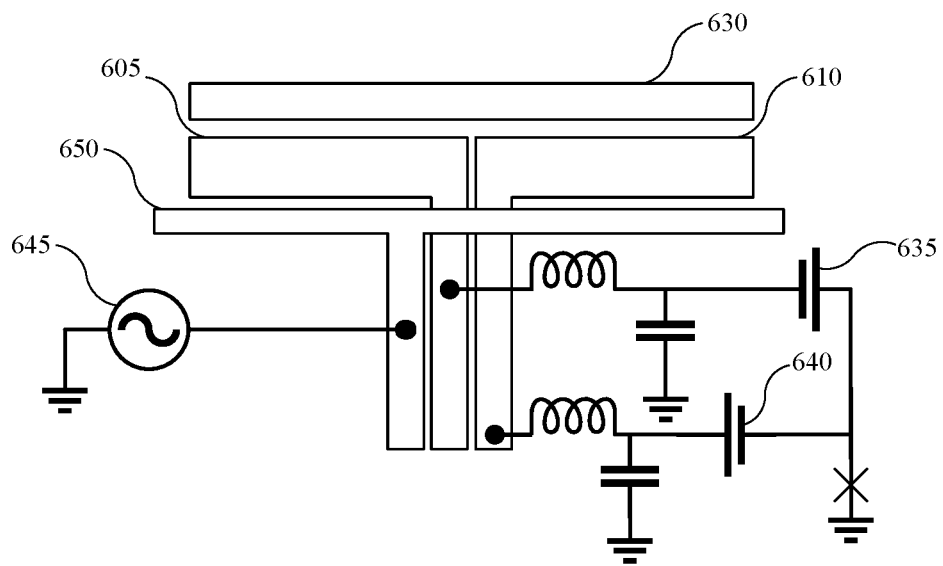
FIG. 6B shows a schematic partial cross-sectional view of an electrode arrangement for an exemplary substrate support assembly according to some embodiments of the present technology.

FIG. 6B shows a schematic partial cross-sectional view of electrode arrangement 600 for an exemplary substrate support assembly according to some embodiments of the present technology, and may include any feature, characteristic, or component as described above, and may be included in any substrate support described elsewhere. As shown in the cross section, the RF electrode 650 by extend below the first bipolar electrode 605 and the second bipolar electrode 610 and may extend radially beyond each of the bipolar electrodes. Similar to as described above, a first DC power supply 635 may be coupled with the first bipolar electrode 605, and a second DC power supply 645 may be coupled with the second bipolar electrode. The DC power supplies may be floating, as previously discussed. Additionally, an RF power supply 645 may be coupled with the RF electrode 650. As the first bipolar electrode 605 and the second bipolar electrode 610 are only coupled with the DC power sources, the bipolar electrodes may be used solely for electrostatic chucking. The circular RF electrode 650 may provide RF delivery to the substrate support surface to facilitate plasma deposition on a substrate.

In operation, the use of a dedicated RF electrode 650 that extends beyond the peripheral edges of the bipolar electrodes prevents the gap 615 from being exposed at positions outside of the wafer, which may prevent electrical arcing from occurring. Arcing may be further mitigated through the use of floating DC power supplies as discussed previously herein. Additionally, by arranging a larger circular RF electrode 650 in a coaxial manner with the smaller substrate seat 630, the electrode arrangement 600 may maintain RF continuity beyond the wafer to ensure that RF flow may be delivered more uniformly across the wafer, including edge regions of the wafer, to facilitate more uniform plasma deposition across the wafer.

Figure 7A:
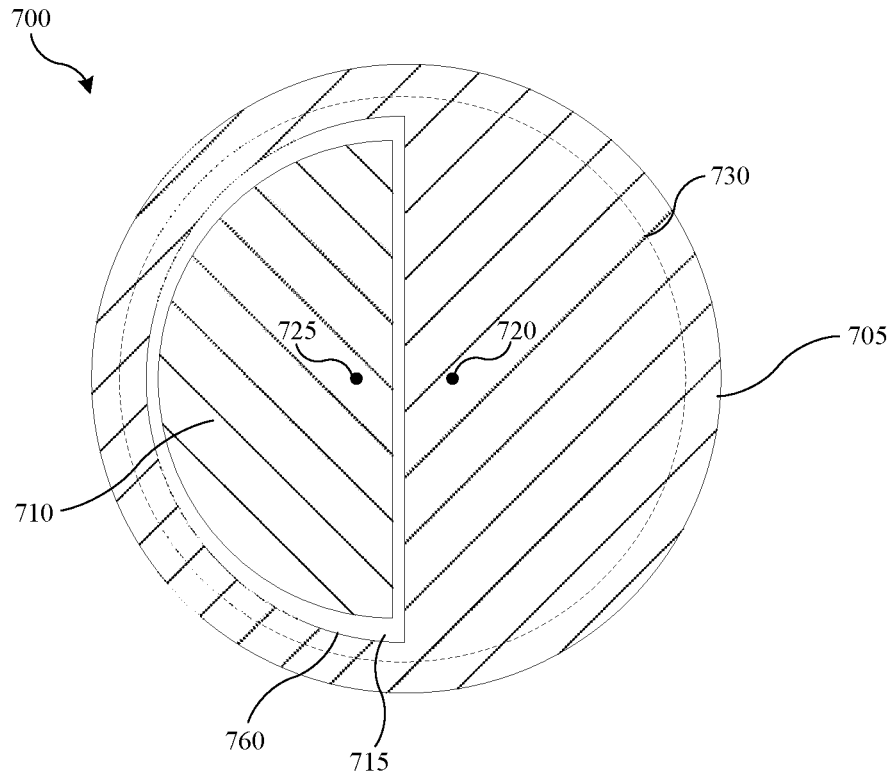
FIG. 7A shows a schematic top view of an electrode arrangement for an exemplary substrate support assembly according to some embodiments of the present technology.

The present technology may similarly encompass other bipolar chuck configurations that can be incorporated within any of the substrate supports as previously described. FIG. 7A shows a schematic top view of an electrode arrangement 700 for an exemplary substrate support assembly according to some embodiments of the present technology. Arrangement 700 may include any of the features or characteristics of arrangement 400, arrangement 500, or arrangement 600, and may be incorporated in any substrate support in which bipolar chucking may be used, including any substrate support previously described. For example, arrangement 700 may include a first bipolar electrode 705 and a second bipolar electrode 710. First bipolar electrode 705 and second bipolar electrode 710 may each include a mesh material that may be substantially coplanar across both electrodes within the electrostatic chuck. As illustrated, the first bipolar electrode 705 may be positioned about the second bipolar electrode 710. For example, the first bipolar electrode 705 may have a generally circular mesh that extends beyond an outer boundary of a substrate seat 730. Within the outer boundary of the substrate seat 730, the mesh of the first bipolar electrode 705 may define a cutout 760 that receives a mesh of the second bipolar electrode 710. As illustrated, the mesh of the second bipolar electrode 710 may have a semicircular shape, although other shapes are possible. The cutout 760 may have a similar shape as the mesh of the second bipolar electrode 710, with a boundary of the cutout 760 being slightly larger than the mesh of the second bipolar electrode 710. This creates a gap 715 that extends between the boundary of the cutout 760 and the outer periphery of the mesh of the second bipolar electrode 710 to separate the first bipolar electrode 705 and the second bipolar electrode. Electrode leads may couple with the meshes of each of the first bipolar electrode 705, such as at position 720 and second bipolar electrode 710, such as at position 725, which may be anywhere along the mesh in some embodiments.

Figure 7B:
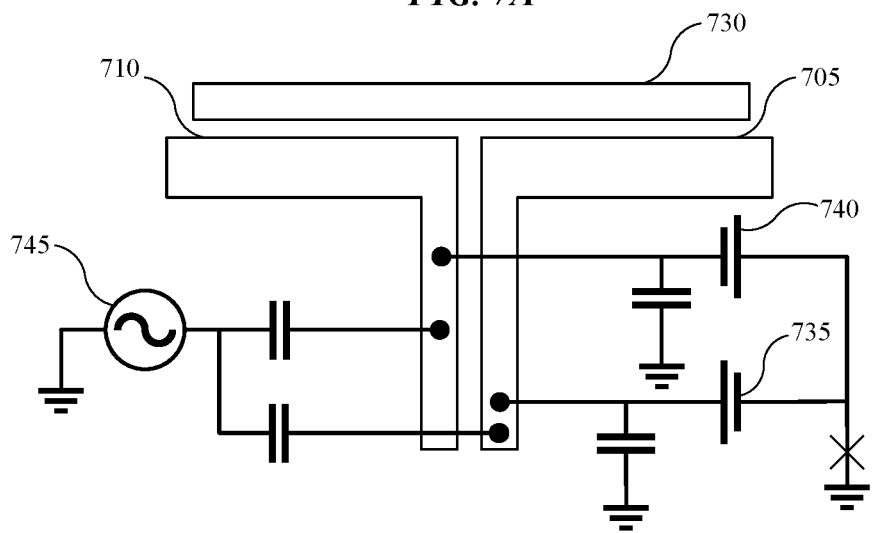
FIG. 7B shows a schematic partial cross-sectional view of an electrode arrangement for an exemplary substrate support assembly according to some embodiments of the present technology.

FIG. 7B shows a schematic partial cross-sectional view of electrode arrangement 700 for an exemplary substrate support assembly according to some embodiments of the present technology, and may include any feature, characteristic, or component as described above, and may be included in any substrate support described elsewhere. It is to be understood that while not shown in the cross-section, it is to be understood that the first bipolar electrode 705 extends about the second bipolar electrode 710. Similar to as described above, a first DC power supply 735 may be coupled with the first bipolar electrode 705, and a second DC power supply 740 may be coupled with the second bipolar electrode. The DC power supplies may be floating, as previously discussed. Either DC power supply may be operated in a positive or negative voltage arrangement, which may be switched during processing, for example, as well as increased or decreased in either direction to provide electrostatic chucking. For example, in some embodiments, the first DC power supply 735 may be operated in a negative voltage arrangement that ensures that the exposed electrode beyond the wafer has a negative charge, which may further reduce plasma particle generation on the substrate support surface. One or more RF power supplies may also be incorporated in some embodiments. For example, an RF power supply 745 may be coupled with the first bipolar electrode 705 and the second bipolar electrode 710, although each bipolar electrode may have a dedicated RF power supply in some embodiments.

In operation, the placement of the cutout 760 and second bipolar electrode 710 radially inward from a boundary of the substrate seat 730 ensures that the gap 715 is not exposed radially outward of the wafer, which may prevent electrical arcing from occurring. Arcing may be further mitigated through the use of floating DC power supplies as discussed previously herein. Additionally, by having peripheral edges of the first bipolar electrode 705 extend radially beyond the entire edge of the substrate seat 730, the electrode arrangement 700 may provide high chucking force at the edge of the wafer and may prevent bowing of the wafer during chucking. The positioning the peripheral edges of the first bipolar electrode 705 may also maintain RF continuity beyond the wafer to ensure that RF flow may be delivered more uniformly across the wafer, including edge regions of the wafer, to facilitate more uniform plasma deposition across the wafer.

Figure 8A:
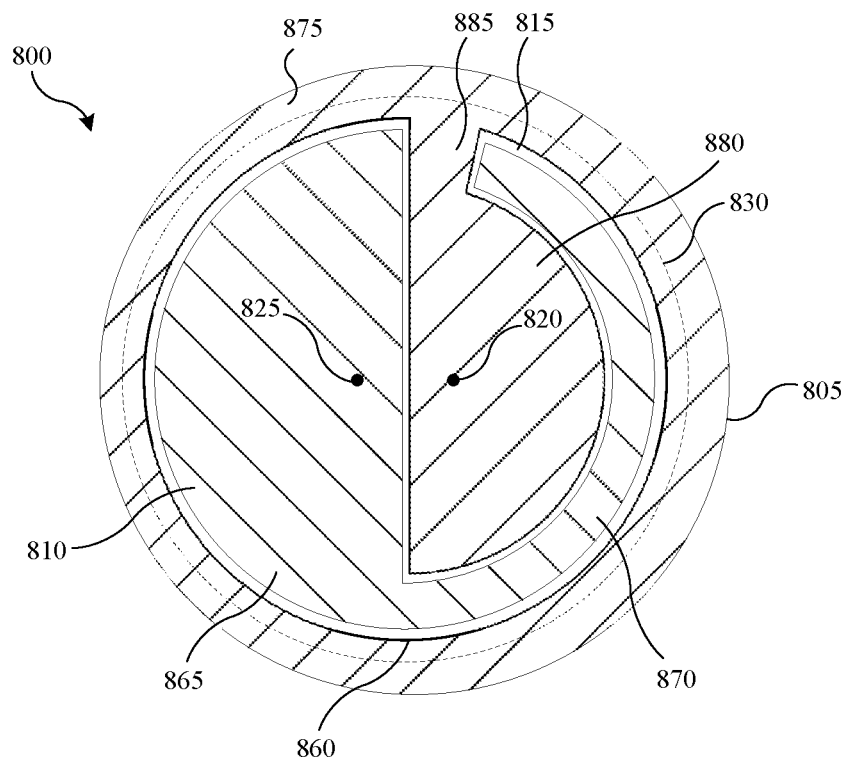
FIG. 8A shows a schematic top view of an electrode arrangement for an exemplary substrate support assembly according to some embodiments of the present technology.

FIG. 8A shows a schematic top view of an electrode arrangement 800 for an exemplary substrate support assembly according to some embodiments of the present technology. Arrangement 800 may include any of the features or characteristics of arrangement 400, arrangement 500, arrangement 600, or arrangement 700, and may be incorporated in any substrate support in which bipolar chucking may be used, including any substrate support previously described. For example, arrangement 800 may include a first bipolar electrode 805 and a second bipolar electrode 810. First bipolar electrode 805 and second bipolar electrode 810 may each include a mesh material that may be substantially coplanar across both electrodes within the electrostatic chuck. As illustrated, the first bipolar electrode 805 may be positioned about the second bipolar electrode 810. For example, the first bipolar electrode 805 may have a generally circular mesh that extends beyond an outer boundary of a substrate seat 830. Within the outer boundary of the substrate seat 830, the mesh of the first bipolar electrode 805 may define a cutout 860 that receives a mesh of the second bipolar electrode 810. As illustrated, the mesh of the second bipolar electrode 810 may be formed of two connected sections. For example, a first section 865 may have semicircular shape, although other shapes are possible. A second section 870 may have an arc shape. For example, the arc shape may extend from an arced portion of the first section 865 such that the arced portion of the first section 865 and the arc shape of second section 870 form a continuous arc.

In some embodiments, the semicircular shape and the arc shape may have a constant rate of curvature. A distal end of the second section 870 may extend from a first end of the first section 865 and may stop prior to contacting the second end of the first section 865. For example, the arc shape of the second portion 870 may extend between about 90 degrees and 175 degrees from the first end of the first section 865 such that a gap is formed between the second end of the first section 865 and the distal end of the second section 870. The cutout 860 may have a similar shape as the mesh of the second bipolar electrode 810, with a boundary of the cutout 860 being slightly larger than the mesh of the second bipolar electrode 810 to create a gap 815 that extends between the first bipolar electrode 805 and the second bipolar electrode 810. For example, the mesh of the first bipolar electrode 805 may have a first annular section 875 with an inner edge that extends about the entire second bipolar electrode 810 but that is radially inward of the outer boundary of the substrate seat 830. An outer edge of the first section extends beyond the outer boundary of the substrate seat 830 such that the outer boundary of the substrate seat 830 is disposed within a medial portion of the first section 875 of the first bipolar electrode 805.

The mesh of the first bipolar electrode 808 may include a second section 880 that is received within an interior of the arc-shaped second section 870 of the second bipolar electrode 810. For example, the second section 880 of the first bipolar electrode 805 may have a semicircular shape. A bridge 885 may extend between the gap formed between the second end of the first section 865 and the distal end of the second section 870 of the second bipolar electrode 810. The bridge 885 may couple the first section 875 and the second section 880 of the first bipolar electrode 805 with one another. Electrode leads may couple with the meshes of each of the first bipolar electrode 805, such as at position 820 and second bipolar electrode 810, such as at position 825, which may be anywhere along the mesh in some embodiments.

Figure 8B:
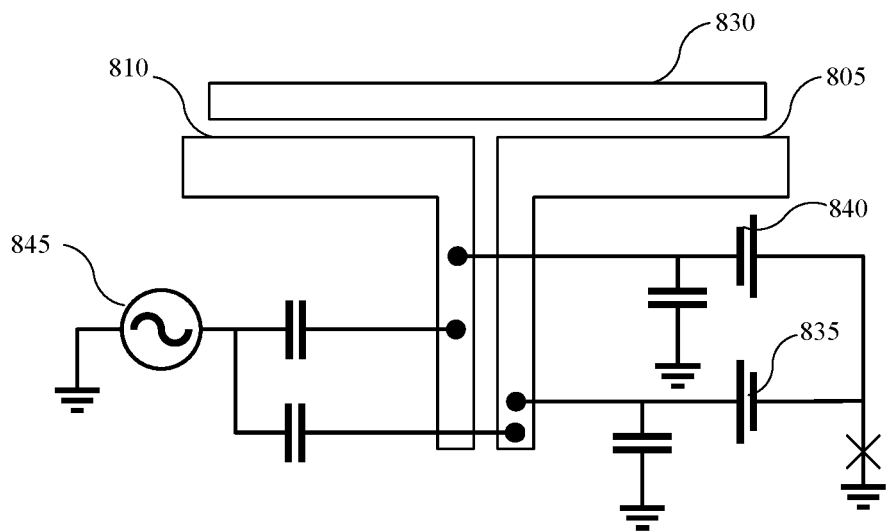
FIG. 8B shows a schematic partial cross-sectional view of an electrode arrangement for an exemplary substrate support assembly according to some embodiments of the present technology.

FIG. 8B shows a schematic partial cross-sectional view of electrode arrangement 800 for an exemplary substrate support assembly according to some embodiments of the present technology, and may include any feature, characteristic, or component as described above, and may be included in any substrate support described elsewhere. It is to be understood that while not shown in the cross-section, it is to be understood that the first bipolar electrode 805 extends about the second bipolar electrode 810. Similar to as described above, a first DC power supply 835 may be coupled with the first bipolar electrode 805, and a second DC power supply 840 may be coupled with the second bipolar electrode. The DC power supplies may be floating, as previously discussed. Either DC power supply may be operated in a positive or negative voltage arrangement, which may be switched during processing, for example, as well as increased or decreased in either direction to provide electrostatic chucking. For example, in some embodiments, the first DC power supply 835 may be operated in a negative voltage arrangement which ensures that the exposed electrode beyond the wafer has a negative charge, which may further reduce plasma particle generation on the substrate support surface. One or more RF power supplies may also be incorporated in some embodiments. For example, an RF power supply 845 may be coupled with the first bipolar electrode 805 and the second bipolar electrode 810, although each bipolar electrode may have a dedicated RF power supply in some embodiments.

In operation, the electrode arrangement 800 may provide similar benefits as described in relation to electrode arrangement 700. For example, the electrode arrangement 800 may prevent electrical arcing from occurring, provide high chucking force at the edge of the wafer, and maintain RF continuity beyond the wafer. Additionally, by utilizing bipolar electrodes with multiple mesh sections, the meshes of the bipolar electrodes may create a more symmetrical RF delivery path to ensure that RF flow is more uniform across the wafer.

Figure 9A:
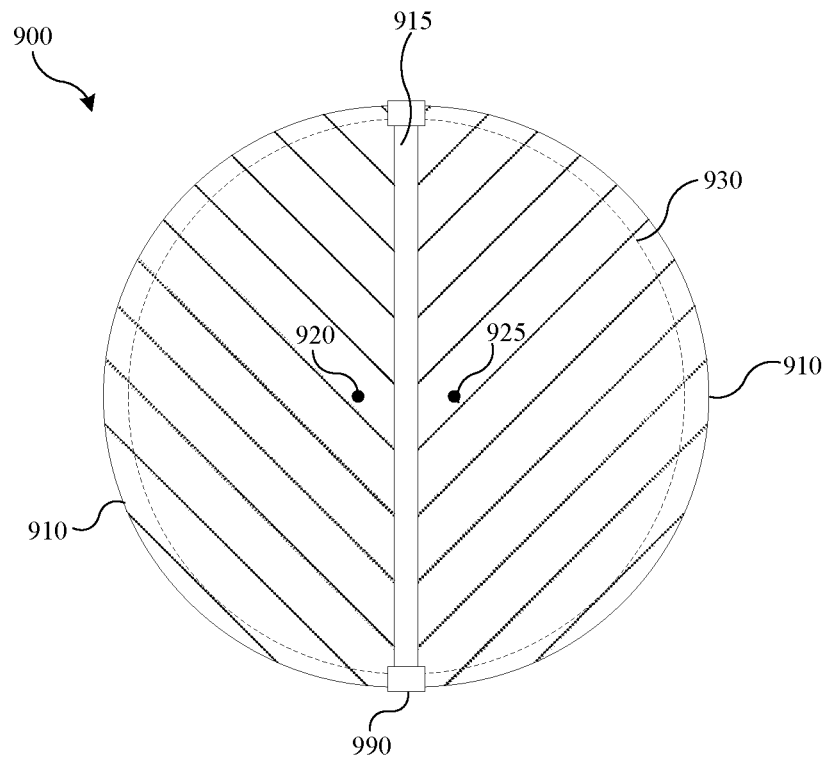
FIG. 9A shows a schematic top view of an electrode arrangement for an exemplary substrate support assembly according to some embodiments of the present technology.

FIG. 9A shows a schematic top view of an electrode arrangement 900 for an exemplary substrate support assembly according to some embodiments of the present technology. Arrangement 900 may include any of the features or characteristics of arrangement 400, arrangement 500, arrangement 600, arrangement 700, or arrangement 800, and may be incorporated in any substrate support in which bipolar chucking may be used, including any substrate support previously described. For example, arrangement 900 may include a first bipolar electrode 905 and a second bipolar electrode 910. First bipolar electrode 905 and second bipolar electrode 910 may each include a mesh material that may be substantially coplanar across both electrodes within the electrostatic chuck. As illustrated, each mesh material has a semicircular shape, however other shapes may be used. The meshes of the first bipolar electrode 905 and the second bipolar electrode 910 may be separated by a gap 915. The meshes of each of the first bipolar electrode 905 and the second bipolar electrode 910 may have outer peripheries that extend radially outward beyond an outer periphery of a substrate seat. Electrode leads may couple with the meshes of each of the first bipolar electrode 905, such as at position 920 and second bipolar electrode 910, such as at position 925, which may be anywhere along the mesh in some embodiments.

As illustrated, in some embodiments the arrangement 900 may include conductive patches 990 that may be doped, embedded, and/or otherwise disposed within the electrostatic chuck body between the bipolar electrodes and the top surface of the electrostatic chuck body. The conductive patches 990 may close the electrical field of the electrodes internally within the electrostatic chuck body and may prevent arcing from occurring at the gap 915. The conductive patches 990 may be aligned with the gap 915 and may extend radially outward from the outer boundary of the substrate seat 930 (although a portion of each conductive patch 990 may extend radially inward of the outer boundary of the substrate seat 930 in some embodiments). In some embodiments, each conductive patch 990 may include a vertical portion that extends downward and that overlaps at least a portion of side surfaces of the bipolar electrodes. For example, the patches 990 may each be L-shaped to help prevent arcing and plasma particle deposition along both a top and side of the electrostatic chuck body, where a leg of the shape extends vertically past a plane of the meshes. In some embodiments, the patches 990 may each be C-shaped to help prevent arcing and plasma particle deposition along a top, side, and bottom of the electrostatic chuck body. The conductive patches 990 may be made of a material that has a coefficient of thermal expansion that is substantially the same as a coefficient of thermal expansion of a material that forms the electrostatic chuck body. As just one example, for an electrostatic chuck body formed from aluminum nitride, the conductive patches 990 may be formed from molybdenum.

Figure 9B:
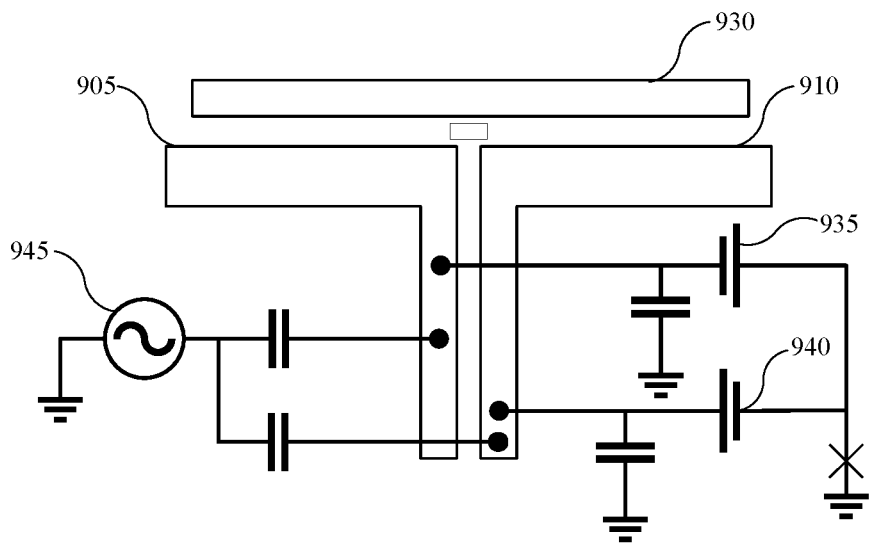
FIG. 9B shows a schematic partial cross-sectional view of an electrode arrangement for an exemplary substrate support assembly according to some embodiments of the present technology.

FIG. 9B shows a schematic partial cross-sectional view of electrode arrangement 900 for an exemplary substrate support assembly according to some embodiments of the present technology, and may include any feature, characteristic, or component as described above, and may be included in any substrate support described elsewhere. Similar to as described above, a first DC power supply 935 may be coupled with the first bipolar electrode 905, and a second DC power supply 940 may be coupled with the second bipolar electrode. The DC power supplies may be floating, as previously discussed. One or more RF power supplies may also be incorporated in some embodiments. For example, an RF power supply 945 may be coupled with the first bipolar electrode 805 and the second bipolar electrode 910, although each bipolar electrode may have a dedicated RF power supply in some embodiments.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the mesh" includes reference to one or more meshes and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A substrate support assembly, comprising:
an electrostatic chuck body defining a substrate support surface that defines a substrate seat;
a support stem coupled with the electrostatic chuck body;
a heater embedded within the electrostatic chuck body;
a first bipolar electrode embedded within the electrostatic chuck body between the heater and the substrate support surface;
a second bipolar electrode embedded within the electrostatic chuck body between the heater and the substrate support surface, wherein:
 a peripheral edge of one or both of the first bipolar electrode and the second bipolar electrode extends beyond an outer periphery of the substrate seat;
 the first bipolar electrode and the second bipolar electrode are separated by a gap;
 the substrate support assembly further comprises conductive patches disposed on opposing ends of the gap; and
 at least a portion of each conductive patch is disposed radially outward of the substrate seat;
an RF power supply coupled with both of the first bipolar electrode and the second bipolar electrode;
a first floating DC power supply coupled with the first bipolar electrode; and
a second floating DC power supply coupled with the second bipolar electrode.

2. The substrate support assembly of claim 1, wherein:
each of the first bipolar electrode and the second bipolar electrode comprises a semicircular mesh; and arc portions of each semicircular mesh extend radially outward of the substrate seat.

3. The substrate support assembly of claim 1, wherein: each conductive patch is formed from a material that has a coefficient of thermal expansion that is substantially the same as a coefficient of thermal expansion of a material that forms the electrostatic chuck body.

4. The substrate support assembly of claim 1, wherein: a portion of each conductive patch extends over a top surface of each of the first bipolar electrode and the second bipolar electrode.

5. The substrate support assembly of claim 4, wherein: each conductive patch comprises a vertical portion that overlaps a side surface of each of the first bipolar electrode and the second bipolar electrode.

6. The substrate support assembly of claim 1, wherein: the electrostatic chuck body comprises a ceramic material.

7. The substrate support assembly of claim 1, wherein: the substrate seat is defined by a recessed region formed in the support surface.

\* \* \* \* \*